United States Patent
Kadyshevitch et al.

(10) Patent No.: US 9,523,714 B2
(45) Date of Patent: Dec. 20, 2016

(54) ELECTRICAL INSPECTION OF ELECTRONIC DEVICES USING ELECTRON-BEAM INDUCED PLASMA PROBES

(71) Applicants: Photon Dynamics, Inc., San Jose, CA (US); Orbotech Ltd., Yavne (IL)

(72) Inventors: Alexander Kadyshevitch, Modi'in (IL); Ofer Kadar, Sunnyvale, CA (US); Arie Glazer, Mevaseret (IL); Ronen Loewinger, San Francisco, CA (US); Abraham Gross, Tel Aviv (IL); Daniel Toet, Santa Clara, CA (US)

(73) Assignees: PHOTON DYNAMICS, INC., San Jose, CA (US); ORBOTECH LTD., Yavne (IL)

( * ) Notice: Subject to any disclaimer, the term of this patent is extended or adjusted under 35 U.S.C. 154(b) by 316 days.

(21) Appl. No.: 14/155,808

(22) Filed: Jan. 15, 2014

(65) Prior Publication Data
US 2014/0132299 A1    May 15, 2014

Related U.S. Application Data

(63) Continuation of application No. PCT/US2012/046100, filed on Jul. 10, 2012.
(Continued)

(51) Int. Cl.
*G01R 31/305* (2006.01)
*G01R 1/07* (2006.01)
*H01J 33/00* (2006.01)

(52) U.S. Cl.
CPC .......... *G01R 1/072* (2013.01); *G01R 31/305* (2013.01); *H01J 33/00* (2013.01); *H01J 2237/164* (2013.01)

(58) Field of Classification Search
CPC ..... G01R 31/305; G01R 31/307; G01R 1/072; G01R 1/07; G01R 31/2653; G01R 13/26; G01N 23/225; H01J 33/00
See application file for complete search history.

(56) References Cited

U.S. PATENT DOCUMENTS

| 4,730,334 A | 3/1988 | Collins et al. |
| 5,032,788 A | 7/1991 | Ringleb et al. |

(Continued)

FOREIGN PATENT DOCUMENTS

| CN | 1333466 A | 1/2002 |
| CN | 1854743 A | 11/2006 |

(Continued)

OTHER PUBLICATIONS

C. K. Birdsall et al, "Particle-in-cell charged-particle simulations, plus Monte Carlo collisions with neutral atoms, PIC-MCC", Plasma Science, IEEE Transactions on, vol. 19, , Apr. 1991, pp. 65-85.

(Continued)

*Primary Examiner* — Son Le
(74) *Attorney, Agent, or Firm* — Nixon Peabody LLP; Joseph Bach, Esq.

(57) ABSTRACT

A non-mechanical contact signal measurement apparatus includes a first conductor on a structure under test and a gas in contact with the first conductor. At least one electron beam is directed into the gas so as to induce a plasma in the gas where the electron beam passes through the gas. A second conductor is in electrical contact with the plasma. A signal source is coupled to an electrical measurement device through the first conductor, the plasma, and the second conductor when the plasma is directed on the first conductor. The electrical measurement device is responsive to the signal source.

45 Claims, 11 Drawing Sheets

Related U.S. Application Data

(60) Provisional application No. 61/508,578, filed on Jul. 15, 2011.

(56) References Cited

U.S. PATENT DOCUMENTS

| | | | |
|---|---|---|---|
| 5,179,279 | A | 1/1993 | Millard et al. |
| 5,202,623 | A | 4/1993 | Lepage |
| 5,268,638 | A | 12/1993 | Brunner et al. |
| 5,465,052 | A | 11/1995 | Henley |
| 5,587,664 | A | 12/1996 | Banitt et al. |
| 5,680,056 | A | 10/1997 | Ito et al. |
| 5,962,325 | A | 10/1999 | Naughton et al. |
| 5,972,323 | A | 10/1999 | Lang et al. |
| 5,973,323 | A * | 10/1999 | Adler ............... H01J 37/285 250/307 |
| 6,118,285 | A | 9/2000 | Parker et al. |
| 6,154,038 | A | 11/2000 | Ito et al. |
| 6,252,412 | B1 | 6/2001 | Talbot et al. |
| 6,366,100 | B1 | 4/2002 | Ito et al. |
| 6,452,177 | B1 | 9/2002 | Feldman et al. |
| 6,809,534 | B2 | 10/2004 | Yamada |
| 6,914,441 | B2 * | 7/2005 | Talbot ................. G06T 7/0004 324/754.23 |
| 6,992,300 | B2 | 1/2006 | Moses et al. |
| 7,151,384 | B2 | 12/2006 | Ueno et al. |
| 7,196,536 | B2 | 3/2007 | Nystrom et al. |
| 7,253,645 | B2 | 8/2007 | Talbot et al. |
| 7,535,238 | B2 | 5/2009 | Abboud et al. |
| 7,746,088 | B2 | 6/2010 | Abboud et al. |
| 7,923,686 | B2 | 4/2011 | Fukushima |
| 7,973,546 | B2 | 7/2011 | Abboud et al. |
| 2001/0015412 | A1 * | 8/2001 | Komori ............. G01R 19/0061 250/492.3 |
| 2005/0057268 | A1 | 3/2005 | Blalock |
| 2006/0103396 | A1 | 5/2006 | Tan et al. |
| 2006/0279297 | A1 | 12/2006 | Nystrom et al. |
| 2007/0145303 | A1 | 6/2007 | Adamec |
| 2007/0148020 | A1 | 6/2007 | McCauley |
| 2008/0063541 | A1 | 3/2008 | Stones |
| 2008/0302964 | A1 | 12/2008 | Shinada et al. |
| 2009/0097115 | A1 * | 4/2009 | Miyazaki ............ B32B 37/1018 359/463 |
| 2010/0068408 | A1 | 3/2010 | Zaykova-Feldman et al. |
| 2013/0134307 | A1 | 5/2013 | Routh, Jr. |
| 2013/0245505 | A1 | 9/2013 | Khuri-Yakub et al. |

FOREIGN PATENT DOCUMENTS

| | | |
|---|---|---|
| JP | H03-37578 A | 2/1991 |
| JP | H07-140209 A | 6/1995 |
| JP | H08-27577 A | 1/1996 |
| JP | 2009-152087 A | 7/2009 |
| JP | 2010-190603 A | 9/2010 |
| TW | 445561 | 7/2001 |
| TW | 573128 | 1/2004 |
| TW | I346060 | 7/2011 |
| WO | 2013/012616 A2 | 1/2013 |
| WO | 2015/051175 A2 | 4/2015 |
| WO | 2016/044642 A1 | 3/2016 |

OTHER PUBLICATIONS

J.P. Verboncoeur et al, "An object-oriented electromagnetic PIC code", Computer Physics Communications, vol. 87, Issues 1-2, May 2, 1995, pp. 199-211.

International Search Report for International patent application PCT/US2012/046100 (Jan. 31, 2013).

Birdsall "particle-in-Cell Charged-Particle Simulations, Plus Monte Carlo Collisions with Neutral Atoms, PIV-MCC, " IEEE Transactions on Plasma Science, vol. 19, No. 2, pp. 65-84 (Apr. 1999).

Verboncoeur "An object-oriented electromagnetic PIC code," Computer Physics Communications 87, pp. 199-211 ((1995).

Taiwan Office Action Dated Mar. 9, 2016.

Invitation to Pay Additional Fees and, Where Applicable, Protest Fee for PCT/US2014/058899 dated Dec. 11, 2014.

International Search Report and Written Opinion for PCT/US2014/058899 dated Feb. 6, 2015.

International Preliminary Report on Patentability for PCT/US2014/058899 dated Apr. 14, 2016.

Invitation to Pay Additional Fees and, Where Applicable, Protest Fee for PCT/US2015/050777 dated Nov. 17, 2015.

International Search Report and Written Opinion for PCT/US2015/050777 dated Jan. 29, 2016.

International Preliminary Report on Patentability for PCT/US2012/046100 dated Jan. 30, 2014.

Office Action in Taiwanese Patent Application No. 101125287 dated Mar. 9, 2016.

Office Action in Japanese Patent Application No. 2014-520256 dated Jun. 9, 2016.

Supplementary Search Report for European Patent Application No. 12814801 dated Feb. 16, 2015.

\* cited by examiner

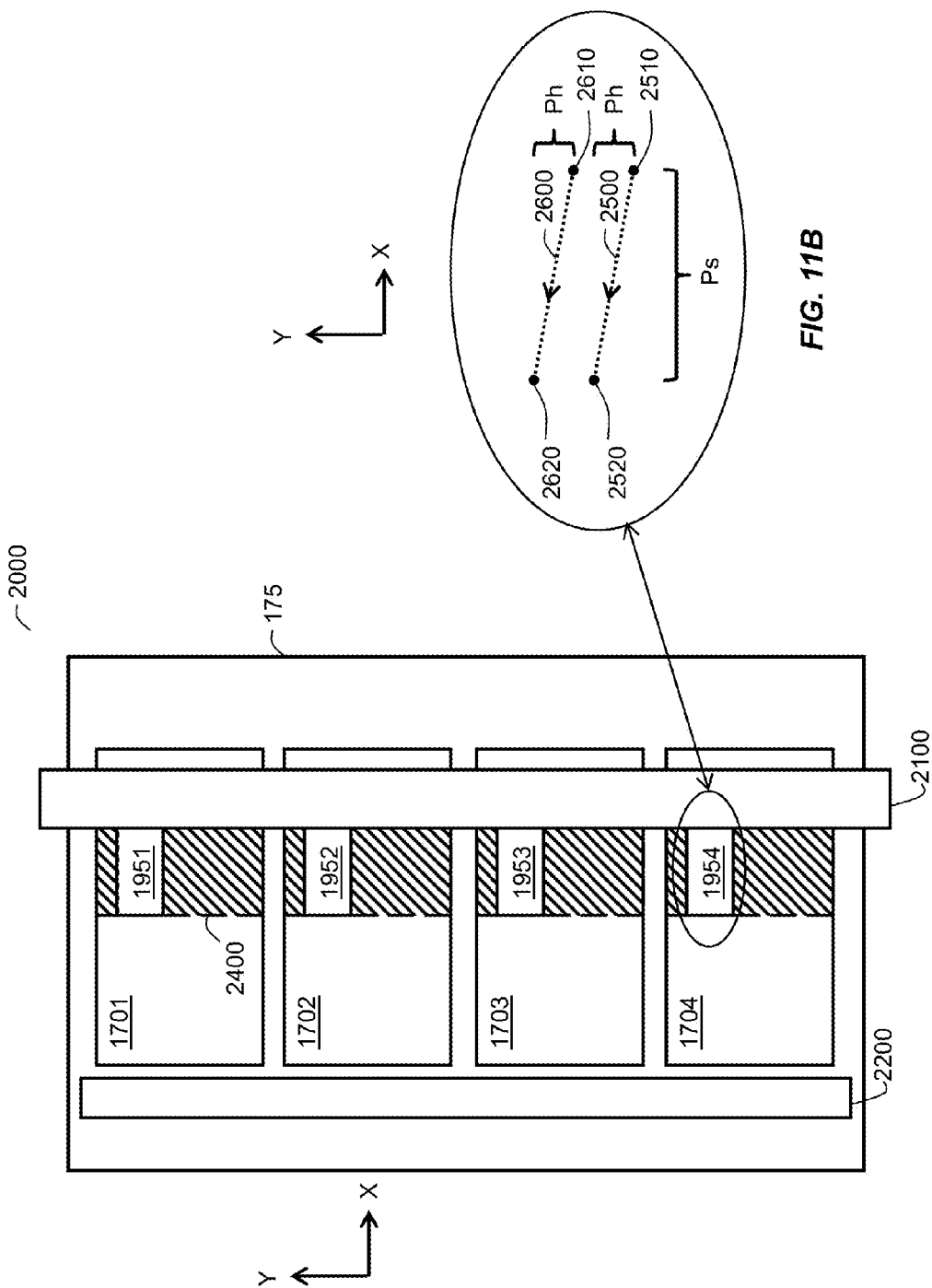

ELECTRICAL INSPECTION OF ELECTRONIC DEVICES USING ELECTRON-BEAM INDUCED PLASMA PROBES

CROSS-REFERENCES TO RELATED APPLICATIONS

This application claims priority to and is a continuation of PCT/US2012/046100, filed Jul. 10, 2012 and entitled "ELECTRICAL INSPECTION OF ELECTRONIC DEVICES USING ELECTRON-BEAM INDUCED PLASMA PROBES", which claims the benefit under 35 U.S.C. §119(e) of U.S. provisional application No. 61/508, 578, filed Jul. 15, 2011, entitled "ELECTRICAL INSPECTION OF ELECTRONIC DEVICES USING ELECTRON-BEAM INDUCED PLASMA PROBES", the contents of which are incorporated herein by reference in their entirety.

BACKGROUND

The present invention relates generally to the non-mechanical contact probing of electronic devices and in particular, to the non-mechanical contact measurement of electronic signals during electrical inspection of electronic devices.

The ability to measure and apply voltages and currents on patterned structures without having to establish mechanical contact is of importance to the functional (electrical) testing of semiconductor devices and flat panel displays, e.g., liquid crystal and organic light emitting diode displays, backplanes, and printed circuit boards, since non-mechanical contact probing minimizes the likelihood of damage to the device/panel under test and is also conducive to improved testing throughput.

Photon Dynamics, Inc. (PDI)/Orbotech's Voltage Imaging® optical system (VIOS), employ electro-optical transducers to translate the electrical fields on the devices under test into optical information recorded by an optical sensor. Other techniques provide an indirect measurement of the voltage on the devices under test by means of secondary electrons and require the devices to be placed in vacuum. These approaches are mostly geared towards voltage measurements and still require mechanical contacts to pads on the periphery of the devices in order to drive the signals used for inspection.

A separate class of inspection methods based on conductive plasmas has recently emerged. The main concept behind these methods is that a directional plasma, which contains mobile secondary electrons besides ions, may act as a non-mechanical contact probe. Several such "plasma probing" approaches have been proposed in the past. They may roughly be divided into two categories, one category being based on high intensity laser-induced ionization, which presents possible risks of laser-induced damage to the device under tests given the high ionization thresholds, and another category being based on high voltage corona discharges, in which ionized species have a wide range of scattering angles and also presents damage risks, especially related to arcing.

Electron beam imaging systems using membranes and differentially pumped apertures have been used to propagate e-beams into a gas ambient for electron beam characterization of live/wet specimens in scanning electron microscopes (SEM) or X-ray diffraction on live samples.

BRIEF SUMMARY

According to one embodiment of the present invention, a non-mechanical contact signal measurement apparatus includes, a first conductor on a structure under test, a gas in contact with the first conductor, and at least one electron beam. The electron beam is directed into the gas so as to induce a plasma in the gas where the electron beam passes through the gas. The non-mechanical contact signal measurement apparatus further includes, a second conductor being in electrical contact with the plasma, and a signal source coupled to an electrical measurement device through the first conductor, the plasma, and the second conductor when the plasma is directed on the first conductor. The electrical measurement device is responsive to the signal source.

According to one embodiment, the non-mechanical contact signal measurement apparatus of further includes a circuit on the structure under test. The circuit is coupled to the first conductor, the electrical measurement device being responsive to the circuit.

According to another embodiment, the signal source is coupled to the first conductor and the electrical measurement device is coupled to the second conductor. According to another embodiment, the electrical measurement device is coupled to the first conductor and the signal source is coupled to the second conductor.

According to another embodiment, the gas is air, molecular nitrogen, or an inert gas. According to another embodiment, the non-mechanical contact signal measurement apparatus further includes, a multitude of electron beams directed into the gas so as to induce a multitude of plasmas in the gas where the electron beams pass through the gas.

According to another embodiment, the structure under test is a thin film transistor array. According to another embodiment, the at least one electron beam is adapted to move in relation to a position of the structure under test.

According to another embodiment, the non-mechanical contact signal measurement apparatus further includes a data storage unit coupled to the measurement device and adapted to store a multitude of data values from the measurement device, and a control unit coupled to the data storage unit, measurement device, and signal source. The data storage unit, measurement device, and signal source are responsive to the control unit.

According to another embodiment, the non-mechanical contact signal measurement apparatus further includes an enclosure adapted to reduce a light incident on the structure under test. Reducing the light improves the accuracy of a data value from the electrical measurement device.

According to another embodiment, the non-mechanical contact signal measurement apparatus further includes; a vacuum enclosure having at least one orifice, the structure under test being outside the vacuum enclosure, and at least one electron beam generator in the vacuum enclosure adapted to direct the at least one electron beam through the at least one orifice. According to another embodiment, the non-mechanical contact signal measurement apparatus further includes, a membrane attached to the vacuum enclosure at the at least one orifice, the at least one electron beam passing through the membrane. The membrane is adapted so as to preserve a vacuum inside the vacuum enclosure and to transmit a first portion of the at least one electron beam through the membrane.

According to another embodiment, the vacuum enclosure includes a vacuum flange, the at least one orifice extending through the vacuum flange. According to another embodiment, the second conductor includes a portion of the vacuum enclosure surrounding the orifice, the gas and the plasma coupling to the portion of the vacuum enclosure surrounding the orifice.

According to another embodiment, the at least one electron beam generator includes, at least one electron source, and at least one electron lens adapted to focus the beam to a spot size. According to another embodiment, the second conductor includes the membrane.

According to another embodiment, the membrane includes a material chosen from the group consisting of silicon nitride, silicon carbide, alumina, diamond-like carbon, graphite, silicon dioxide, ultrathin carbon, beryllium, beryllium nitride and polyimide. According to another embodiment, the membrane includes a deposited layer overlying a substrate. The substrate is removed from a window region through a portion of the substrate. The substrate is adapted to form a frame supporting the membrane, and the at least one electron beam is directed through the window region in the frame.

According to another embodiment, the second conductor includes a conductive film overlaying the membrane, the at least one electron beam passing through the conductive film. The conductive film is adapted so as to transmit a second portion of the at least one electron beam through the conductive film, and the gas and the plasma is coupled to the conductive film. According to another embodiment, the non-mechanical contact signal measurement apparatus further includes a multitude of electron sources.

According to another embodiment, the frame is coupled to the vacuum enclosure by a bond or clamp so as to position the window region to match with the orifice enabling the at least one electron beam to strike the membrane through the window region in the frame. According to another embodiment, the window region is shaped as a slit and the at least one electron beam generator includes, at least one electron source, at least one electron lens to focus the beam to a spot size, and at least one deflection optic adapted so as to scan the electron beam through the slit. According to another embodiment, the conductive film includes an adhesion layer overlaying the membrane and a conductive layer overlaying the adhesion layer, the gas and plasma being coupled to the conductive layer.

According to one embodiment of the present invention, a method for signal measuring by non-mechanical contact includes, providing a first conductor on a structure under test, providing a gas in contact with the first conductor, and directing at least one electron beam into the gas so as to induce a plasma in the gas where the electron beam passes through the gas. The method for signal measuring by non-mechanical contact further includes, coupling a second conductor electrically with the plasma, and coupling a signal source to an electrical measurement device through the first conductor, the second conductor, and the plasma when the plasma is directed on the first conductor to cause the electrical measurement device to respond to the signal source.

According to one embodiment, the method further includes storing a plurality of data values from the electrical measurement device in a data storage unit, the plurality of data values being associated with the circuit on the structure under test, and controlling the data storage unit, electrical measurement device, and signal source by a control unit.

According to another embodiment, the controlling step of the method includes setting a first electrical characteristic of a first signal line on the structure under test to a first condition. A first one of the multitude of data values associated with a second electrical characteristic of a second signal line on the structure under test is stored. The first data value is associated with the first condition. The first electrical characteristic is set to a second condition. A second one of the multitude of data values associated with the second electrical characteristic is stored. The second data value is associated with the second condition. The second electrical characteristic is responsive to the first electrical characteristic through the circuit.

According to another embodiment, the method further includes monitoring for a defect in the circuit on the structure under test, and registering in a control unit if the defect is detected. The method further includes storing a multitude of data values from the electrical measurement device in a data storage unit if the defect was detected and controlling the data storage unit, electrical measurement device, and signal source by the control unit. The multitude of data values are associated with the defect in the circuit on the structure under test.

A better understanding of the nature and advantages of the embodiments of the present invention may be gained with reference to the following detailed description and the accompanying drawings.

BRIEF DESCRIPTION OF THE DRAWINGS

FIG. 11A is a block diagram top view of a non-mechanical contact signal measurement system with multiple, movable inspection heads, in accordance with one embodiment of the present invention.

FIG. 11B is a magnified inset showing details of plasma probe movement in the apparatus of FIG. 11A, in accordance with one embodiment of the present invention.

DETAILED DESCRIPTION

An apparatus, in accordance with one embodiment of the present invention, includes an inspection technology and subsystem based on electron beam-induced plasma probes to enable non-mechanical contact signal measurements. Electron beams may provide efficient ionization of air or other gasses, and generate highly directional plasma columns with little risk of damage to the device under test (hereinafter alternatively referred to as structure under test). Electron beams also may provide the control of the lateral size of the plasma probe, which is an important advantage for the measurement of electrical signals on small, high-density conductors on the device.

Figure 1:
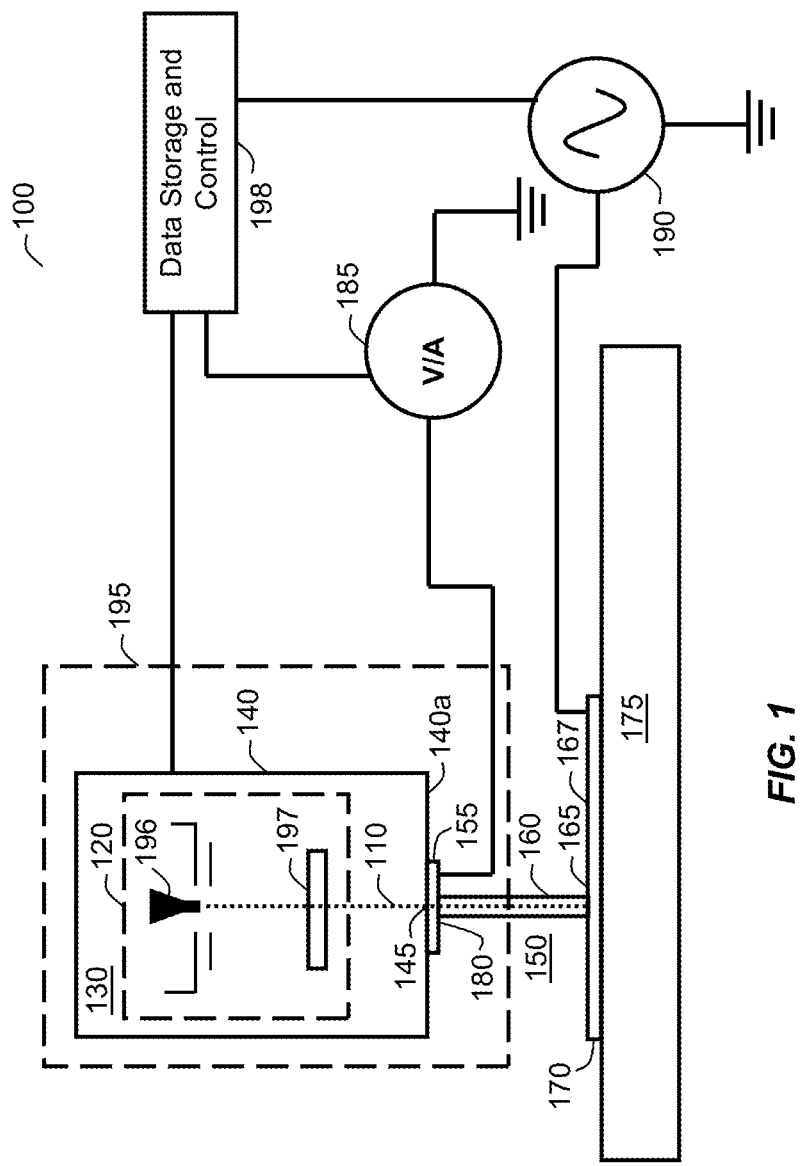
FIG. 1 is a schematic and cross sectional view of a non-mechanical contact signal measurement apparatus, in accordance with a first embodiment of the present invention.

FIG. 1 is a schematic and cross sectional view of a non-mechanical contact signal measurement apparatus 100, in accordance with a first embodiment of the present invention. An electron beam 110 is generated by an electron beam generator 120 in a vacuum 130 using conventional methods. Electron beam 110 egresses a vacuum enclosure 140 (hereinafter alternatively referred to as vacuum chamber) through an orifice 145 located in a portion of the vacuum enclosure 140a. A portion of the electron beam is passed to an ambient gas 150 (hereinafter alternatively referred to as ambient or gas) outside the vacuum enclosure through a membrane and frame assembly 155 that preserves the vacuum inside the vacuum enclosure containing the electron beam generator but is semi-transparent to the electron beam. Alternatively, membrane and frame assembly 155 may be optional when the orifice or multiplicity of orifices is small enough to preserve the vacuum inside the vacuum enclosure.

Upon entering the ambient gas, the electrons in the portion of the electron beam collide with the gas atoms and are deflected or lose energy through ionization. Thus, the portion of the electron beam that is directed into the gas induces a plasma 160 (hereinafter alternatively referred to as plasma probe) in the gas where the electron beam passes through the gas. Aside from slow gas ions, these electron-gas collisions create low-energy secondary electrons that are free to conduct. Therefore, voltages and currents may be measured or applied through the plasma. The plasma may then act as a contactless or non-mechanical contact electrical probe or a plasma probe. Backscattered electrons are not used to carry the voltage or current signals in the plasma probe.

FIG. 1 also shows a first conductor 165 is provided on a structure under test 170 and the gas may be in contact with the first conductor. The structure under test may be supported by or implemented on a base 175. The "device" or "structure under test" side of the membrane and frame assembly facing away from or outside the vacuum enclosure, may be coated with a second conductor 180, which may be a thin conductive film, as will be described in greater detail below. Gas 150 is between or in contact with first conductor 165 and second conductor 180. In an alternative embodiment, a portion of the vacuum enclosure surrounding the orifice may be made in conductive material or material coated with a conductive device-side film corresponding to the second conductor. In another alternative embodiment, the second conductor may be formed as a separate electrode or film that is somewhere between membrane/frame assembly 155 and the first conductor, but not necessarily attached directly to the membrane, so long as the second conductor is electrically coupled to the plasma, does not disturb the portion of the electron beam outside the vacuum enclosure, and may be attached to an inspection head 195. The vacuum enclosure, the electron beam generator, and the second conductor may be referred to as inspection head 195 that generates the plasma probe.

Second conductor 180 may be coupled to an electrical measurement device 185 or a signal source 190. A data storage and system control block 198 controls testing routines and stores measured data and is coupled to inspection head 195, electrical measurement device 185, and signal source 190. The data storage unit within data storage and system control block 198 may be coupled to the measurement device and adapted to store a plurality of data values from measurement device 185. A control unit within data storage and system control block 198 may be coupled to the data storage unit, measurement device 185, and signal source 190. The data storage unit, measurement device 185, and signal source 190 may be responsive to the control unit.

Examples of voltages and currents measured by embodiments of such a plasma probe will be discussed below. Since second conductor 180 is in electrical contact with or coupled to plasma 160, the signal source may be coupled to the electrical measurement device through first conductor 165, plasma 160, and second conductor 180 when the plasma is directed on first conductor 165. In other words, signal source 190, first conductor 165, plasma 160, second conductor 180, and electrical measurement device 185 may form a conductive loop when the plasma is directed on first conductor 165, causing electrical measurement device 185 to be responsive to signal source 190. Electrical measurement device 185 may measure voltage, current, AC or DC signals, or may measure any of those signals as a function of time, as is commonly practiced. Signal source 190 may drive voltage, current, AC or DC signals, or may provide any of those signals as a function of time, as is commonly practiced. The position of electrical measurement device 185 and signal source 190 are interchangeable in the conductive loop. In the embodiment shown in FIG. 1, the signal source is coupled to the first conductor and the electrical measurement device is coupled to the second conductor.

One embodiment of the non-mechanical contact signal measurement apparatus may further include a circuit 167 on the structure under test. Circuit 167 may be coupled to the first conductor, and the electrical measurement device may be further responsive to the circuit. Since, second conductor 180 is in electrical contact with or coupled to plasma 160, the signal source may be coupled to the electrical measurement device through first conductor 165, circuit 167, plasma 160, and second conductor 180 when the plasma is directed on first conductor 165. In other words, signal source 190, first conductor 165, circuit 167, plasma 160, second conductor 180, and electrical measurement device 185 may form a conductive loop when the plasma is directed on first conductor 165, enabling electrical measurement device 185 to be responsive both to signal source 190 and circuit 167. The measurement device may thus be able to perform characterization of the circuit on the structure under test.

The structure under test is preferably outside the vacuum enclosure proximal to the second conductor. Preferably, the first conductor on the device under test is located at a gap distance large enough from the second conductor to prevent mechanical interference with the inspection head, but small enough to ensure adequate signal through the plasma, e.g. sufficiently low plasma probe resistance to successfully couple the electrical signal between the first and second conductors. The gap distance may be maintained by a gap control mechanism (not shown). The gap control apparatus is adapted so as to provide a gap between the structure under test and the second conductor in a range of 30 to 500 um. If the gap is below 30 um, the likelihood of mechanical interference increases. If the gap is above 500 um, the plasma column diameter may become too large even at high e-beam energy. The gap distance may be controlled within a tolerance for a desired gap distance, e.g. +/−5 um.

Figure 8:
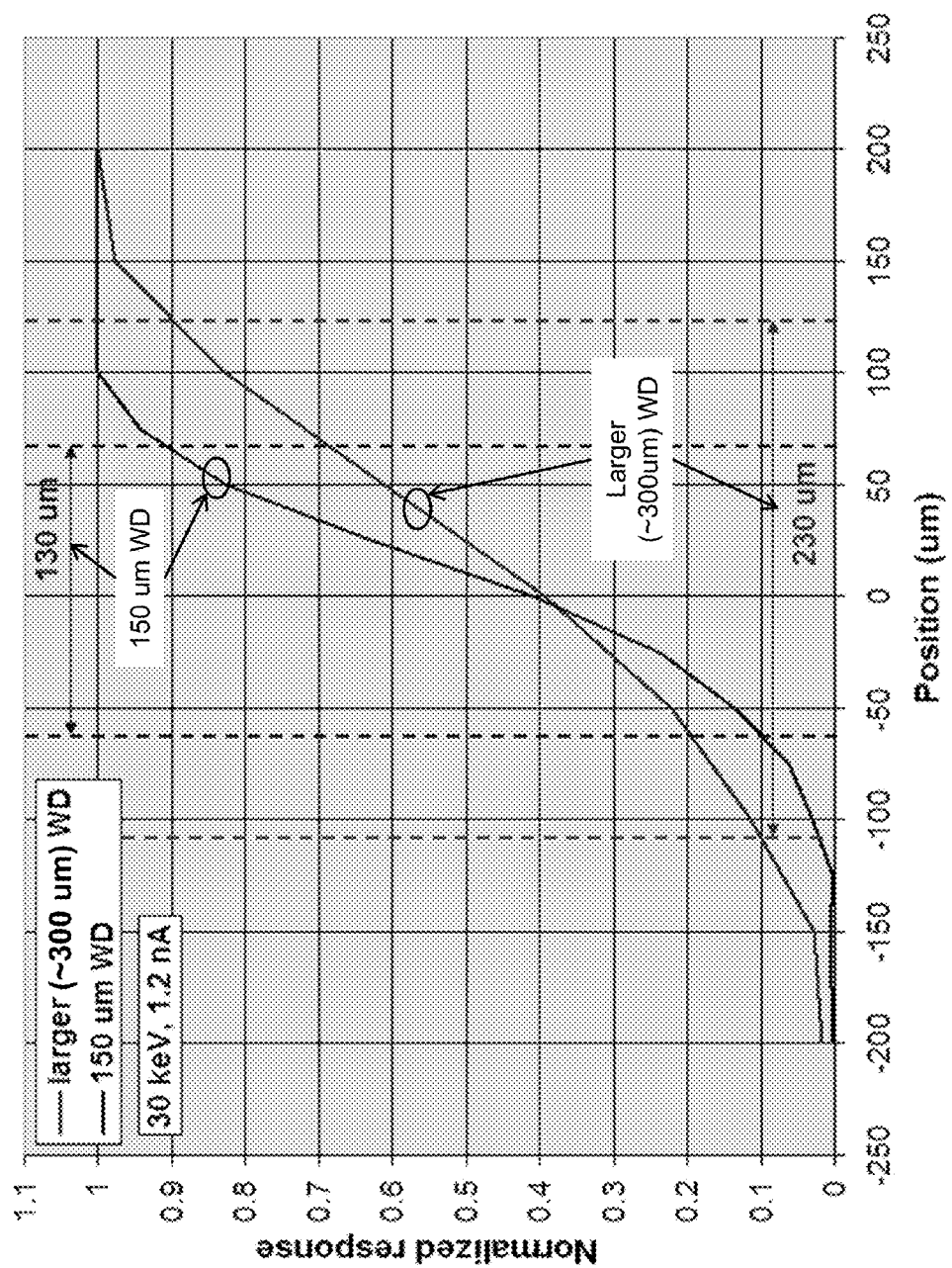
FIG. 8 shows exemplary characterization data for plasma beam spatial response associated with the non-mechanical contact signal measurement apparatus of FIGS. 1 and 2.

Increasing the gap separation between the measurement side of inspection head 195 (or more specifically membrane and frame assembly 155) and structure under test 170 causes the plasma probe diameter to broaden as shown in FIG. 8 and explained in more detail below. The resolution of the system degrades as the plasma probe broadens which suggests minimizing the gap to improve resolution. Counterintuitively, the plasma probe resistance decreases as gap distance increases due to the plasma probe diameter broadening. However, if the inspection head touches down due to a small gap, it could damage the structure under test or the inspection head. Thus, the optimal gap separation is a compromise between system resolution and the desire to prevent damage from touch down. For example, a minimum separation of 50 um is desirable for flat panel display inspection applications, though for other applications the minimum desirable separation may be different. The separation may preferably not be larger than 500 um to prevent excessive loss of signal through high plasma resistance. The separation between the inspection head and the device under test may be maintained by a number of different open-loop and closed-loop gap control methods. One example is the 3 point air-bearing currently used to float the electro-optical modulator in Orbotech/PDI's VIOS-based Array Checker™ systems. Other gap control mechanisms may include actuators such as voice coils and piezo-electric elements and gap (feed-back) sensors such as optical interference sensors, capacitive sensors and pressure sensors.

Figure 2:
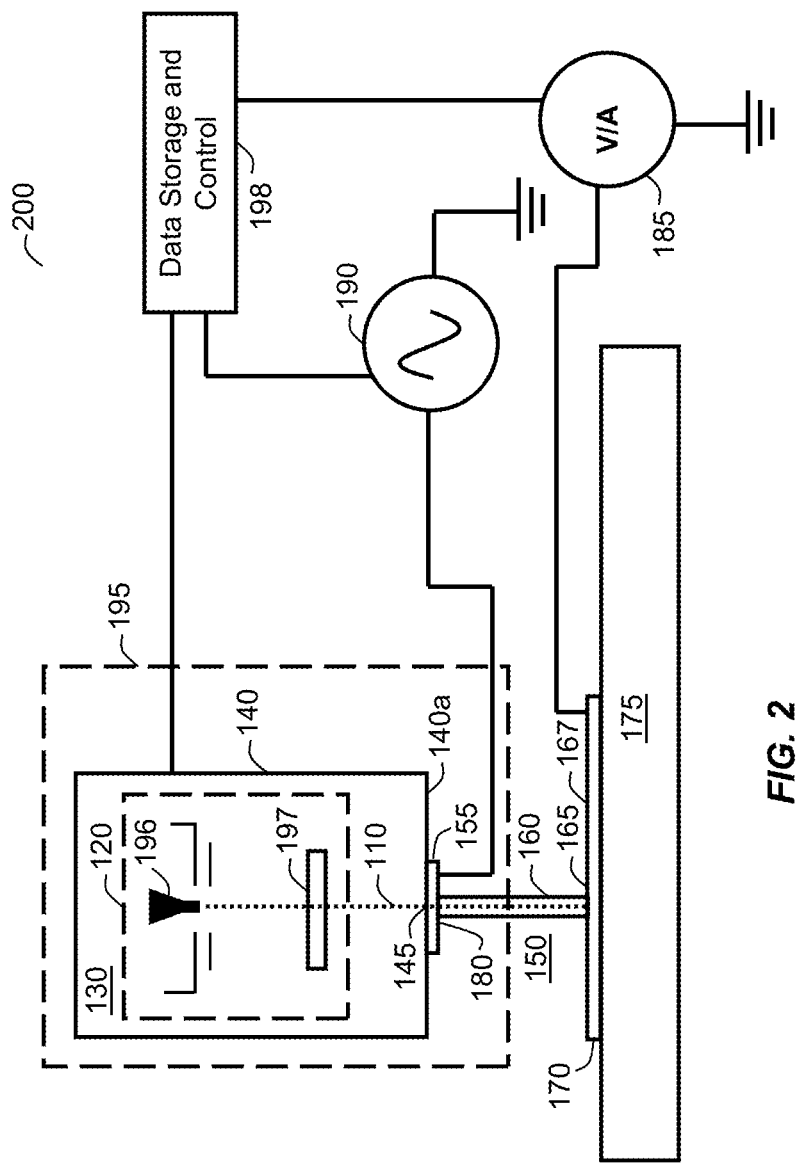
FIG. 2 is a schematic and cross sectional view of a non-mechanical contact signal measurement apparatus, in accordance with a second embodiment of the present invention.

FIG. 2 is a schematic and cross sectional view of a non-mechanical contact signal measurement apparatus 200, in accordance with a second embodiment of the present invention. The embodiment shown in FIG. 2 corresponds to the embodiment shown in FIG. 1 except in the embodiment shown in FIG. 2, electrical measurement device 185 is coupled to first conductor 165 and signal source 190 is coupled to second conductor 180. The other elements in FIG. 2 have the same functions as those in FIG. 1 with the same reference numbers and will not be described in detail again.

Figure 3:
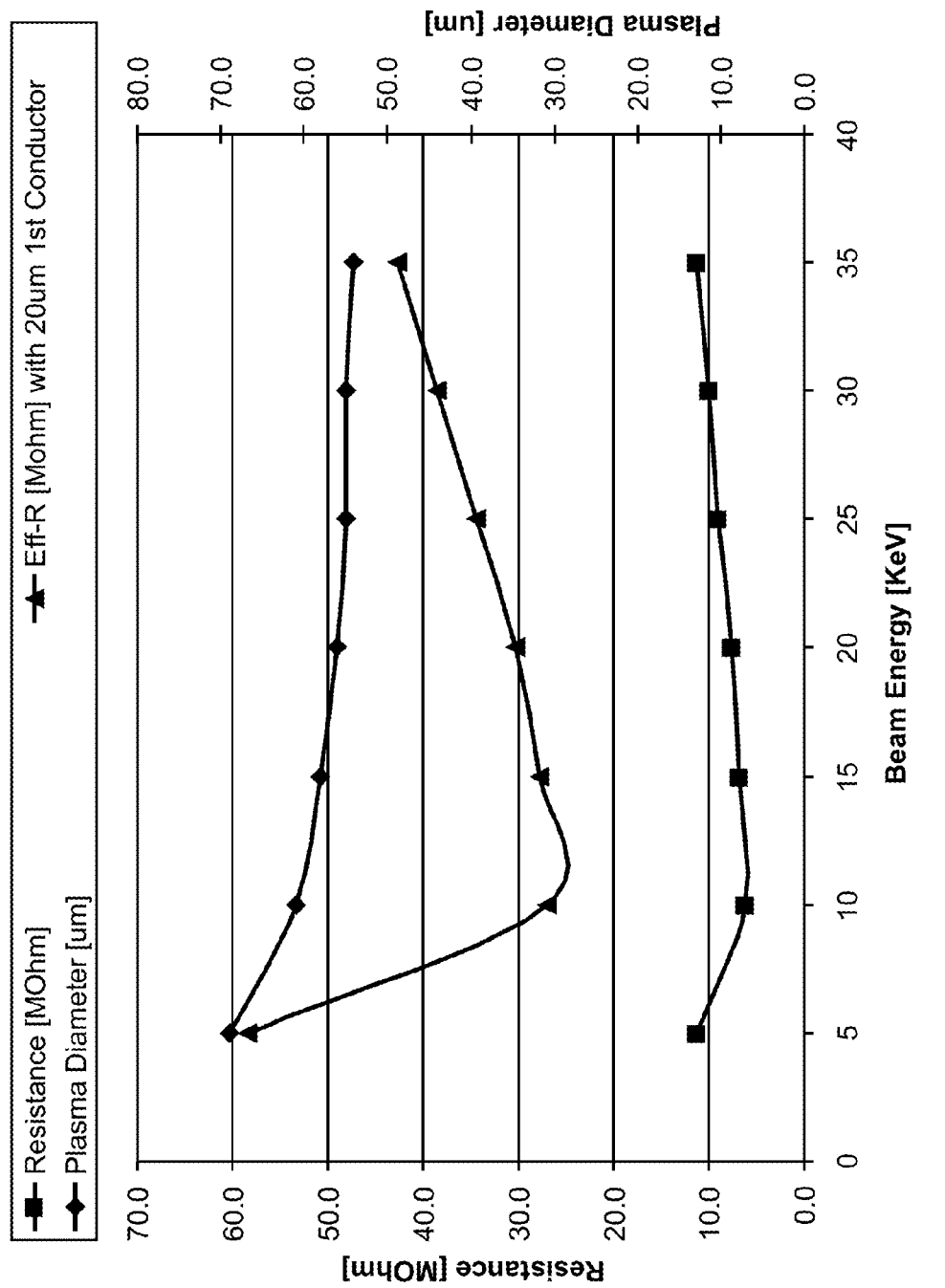
FIG. 3 shows exemplary simulation data for plasma beam resistance, effective plasma beam resistance, electron beam energy, and plasma beam diameter associated with the non-mechanical contact signal measurement apparatus of FIGS. 1 and 2.

In order to determine suitable working conditions for the e-beam induced plasma probe method, simulations of the spatial and temporal distributions of the primary and secondary electrons as well as the ions involved in the process have been performed. FIG. 3 shows exemplary simulation data for plasma beam resistance, effective plasma beam resistance, electron beam energy, and plasma beam diameter associated with the non-mechanical contact signal measurement apparatus of FIGS. 1 and 2. Many approaches may be used for this purpose, for instance, a model based on the particle-in-cell (PIC) method combined with the Monte Carlo Collision (MCC) method was chosen since this has historically shown to yield accurate results. The PIC method is used to track the trajectories of particles in self-consistent electromagnetic fields determined on a fixed mesh. The MCC method is used to simulate collisions between charged particles. The assumed ambient gas for the simulations was molecular nitrogen ($N_2$) to represent a first order composition of air. The simulation may provide a full characterization of the plasma. Various output parameters may be simulated, for instance plasma resistance and the diameter of the plasma at the level of the target or device under test. Plasma resistance and the diameter of the plasma are both quantities related to the secondary electron distribution.

The results of the simulation model indicate that, for a given membrane to target (e.g. second to first conductor) separation or gap, lower beam energies shall result in lower plasma resistance values, down to a threshold beam energy where the electron beam no longer efficiently ionizes the gas, at which point further reductions below the threshold beam energy cause the resistance to increase. For example, for 50 um membrane-target separation, the plasma resistance has a minimum of 2.7 MOhm at 5 keV, while for 100 um separation, the minimum increases to 6 MOhm at 10 keV. On the other hand, the plasma diameter decreases with beam energy although it levels off above a certain value. For instance, the plasma diameter decreases from 85 um to 60 um when the energy is increased from 5 to 20 keV, but does not change much for higher energies. These results show how the parameters of the inspection may be chosen to obtain a suitable combination of plasma resistance and diameter. However, it may not be possible to simultaneously minimize the plasma resistance and diameter since these parameters have opposite dependencies on the beam energy. An optimum may be further achieved by determining the effective resistance of the portion of the plasma overlapping with a typical device structure. For instance, lines in a liquid crystal display (LCD) array may be 5-50 um wide. Note that for a given beam energy the plasma diameter decreases with working distance and is not much impacted by the electron beam spot size as long as it small compared to the lateral diffusion distance of the secondary electrons. Simulations of other gas mixtures including a mixture of $N_2$ and $O_2$ (which more accurately represent the composition of air) were performed, which are described in greater detail below in reference to FIG. 11, and agree with the above conclusions.

Referring again to FIG. 1, electron beam generator 120 in vacuum enclosure 140 may include an electron source 196 and an electron optics 197. The electron optics 197 may include at least one electron lens and at least one deflection optic (not shown). A wide variety of electron sources may be used to generate the electron beams to induce the plasma probes. These include; thermionic, field emission, and Schottky sources. Electron beam energies may be in a range between 5 to 50 keV to efficiently ionize the ambient gas over the path from first conductor to second conductor (about 50-500 um). Electron beam energy below 5 keV will lead to excessive beam broadening due to scattering and may result in excess heating of the membrane and frame assembly. Electron beam energy above 50 keV will result in primary electrons that do not sufficiently participate in the ionization process, contributing to higher plasma resistance. To control the lateral dimensions of the plasma probe; i.e., the spatial resolution of the plasma probe technology, the beam diameter or spot size at the point of entry into the ambient should preferably be small with respect to the smallest distance between features on the device under test. For most display-related applications, electron beam diameters or spot sizes less than or equal to 500 um are acceptable.

Aside from electron lenses used for focusing the beam to the desired spot size, the electron beam generator may also include at least one deflection optic that may be used to deflect, steer, or modulate the beam (not shown). The electron beam generator in the vacuum enclosure is adapted to direct the electron beam through orifice 145. In another embodiment, inspection heads may have multiple sources or multiple beams originating from a single source directing a plurality of electron beams into the gas so as to induce a multitude of plasmas in the gas where the electron beams pass through the gas.

Typical vacuum levels in the electron beam assembly may be in the 10−7 Torr or lower range and may be achieved by a variety of pumping methods, including turbo pumps, ion pumps, diffusion pumps, and the like. Ambient gasses may preferably be non-toxic and have high ionization cross-section including such gasses as air, molecular nitrogen ($N_2$), argon (Ar), or other inert gasses. In one embodiment, the gas is at atmospheric pressure. In another embodiment, the gas is air at atmospheric pressure.

Figure 4:
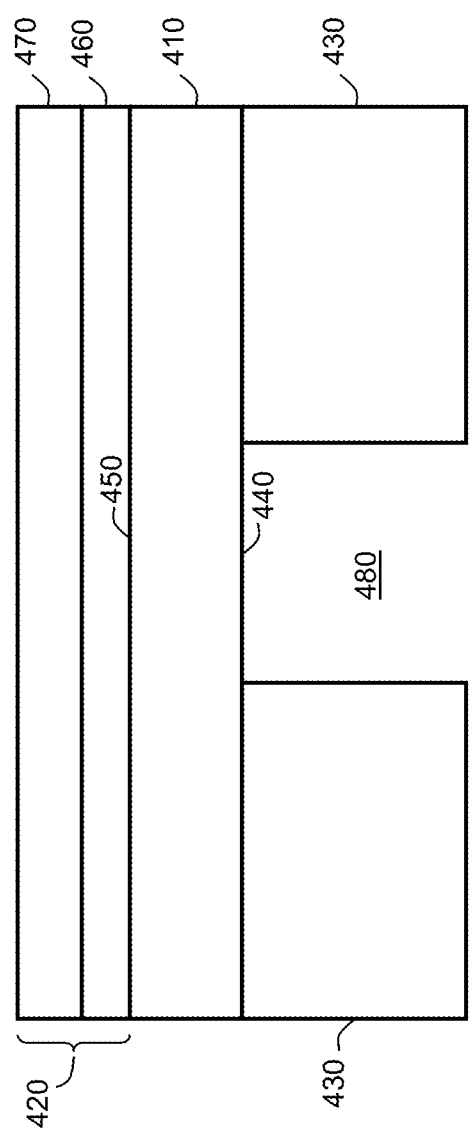
FIG. 4 is a simplified cross section view of a membrane and frame assembly, in accordance with one embodiment of the present invention.

FIG. 4 is a simplified cross section view of a membrane and frame assembly 155, in accordance with one embodiment of the present invention. Membrane and frame assembly 155 may include a membrane 410, a conductive film 420 overlaying the membrane, and a frame 430 supporting the membrane. Conductive film 420 may correspond to second conductor 180 as shown in FIG. 1 and membrane 410 is attached via the membrane and frame assembly 155 to vacuum enclosure 140 at orifice 145. As shown in reference to FIG. 4, membrane 410 has a first surface 440 and a second surface 450 and is adapted so as to preserve a vacuum inside the vacuum enclosure and to transmit a first portion of the electron beam through the membrane. First surface 440 of the membrane faces towards the inside of the vacuum enclosure so the electron beam from the electron beam generator strikes on the first surface of the membrane through window region 480 in frame 430. Second surface 450 of the membrane is facing towards the outside of the vacuum enclosure or towards the structure under test. Second surface 450 of the membrane is where the first portion of the electron beam, which may have been slightly attenuated by the membrane, is emitted from the membrane in one alternative embodiment when the conductive film is not deposited overlaying the membrane (not shown).

Membrane 410 is made from a material that may have low atomic number (for example, less than or equal to 15) to ensure good electron transparency. Membrane materials with atomic number above 15 will induce excessive e-beam scattering in the membrane. Membrane materials may also be robust to high pressure differences. Such membrane materials may include silicon nitride ($Si_xN_y$), silicon carbide (SiC), alumina ($Al_2O_3$), diamond-like carbon, graphite, silicon dioxide, ultrathin carbon, beryllium and beryllium nitride and polyimide (used in Quantomix™ capsules). The membrane material thickness may be in a range between and including 8 to 500 nm to achieve the requisite electron transparency and robustness to vacuum. If the membrane material thickness is below 8 nm, the membrane will not be able to mechanically withstand the pressure differential between the vacuum in the vacuum enclosure and the gas outside the vacuum enclosure. If the membrane material thickness is above 500 nm, the membrane will not be able to transmit the e-beam. The lateral size of the membrane depends on heating and beam alignment considerations with sizes ranging from 0.01 to 5 mm. Lateral membrane size less than 0.01 mm is limited by; i) difficulty with aligning the e-beam to the window region in the frame assembly, and ii) the need for the window region in the frame assembly to be larger than the e-beam width. Lateral membrane size greater than 5 mm is limited by excessive thermal resistance, which may result in overheating of the membrane by the e-beam. Since thin films may have low thermal conductivity, high temperatures may stem from primary electrons absorption related heating at certain beam current levels. Therefore, the membrane may have a good thermal coupling to a heat sink source (i.e. part of the vacuum enclosure) which may be achieved by selection of a narrow membrane window region, design of a membrane window region mesh or grid, or by depositing a metal grid on the membrane.

Some membrane materials are not electrically conductive and thus may need one or more additional conductive coatings to enable measurements or the application of signals to be coupled to the plasma probe. The second conductor may include conductive film 420 overlaying second surface 450 of membrane 410. Conductive film 420 may be adapted so as to transmit a second portion of the electron beam due to minor attenuation. The gas and the plasma may be in contact with conductive film 420 causing the signal to be coupled to the plasma probe. Metallic coatings are well suited for being the conductive film; the best candidates have high conductivity, good adhesion to the membrane, low reactivity, as well as low density and low atomic number to minimize electron scattering. Conductive film 420 may include an adhesion layer 460, which is deposited overlaying second surface 450 of the membrane, and a conductive layer 470, which is deposited overlaying the adhesion layer. Several film layers may be combined to meet these requirements. For example, adhesion layer 460 may include Ti or TiW for adhesion improvement and conductive layer 470 may include Au for high conductivity and low reactivity. In an alternative embodiment, conductive film 420 may be a single layer of metal with low atomic number, low resistivity, and high melting point, such as Ti, Be, Sc, V, or Cr. The thicknesses of the conductive film 420 may preferably be in a range between 10 to 50 nm. The thicknesses of the conductive film is equal or below 50 nm to keep the attenuation and scattering of the electron beam low, while the thickness is equal or above 10 nm to provide sufficient conductivity and adhesion.

In another embodiment (not shown), when an orifice or multitude of orifices in the electron beam generation enclosure is used instead of a vacuum sealing membrane to maintain the vacuum, a conductive electrode may be situated near the orifice as the second conductor and adapted to electrically couple to the e-beam induced plasma so as to detect or inject electrical signals in the plasma without disturbing the e-beam's egress out of the orifice. In another embodiment (not shown), the second conductor may include a portion of the vacuum enclosure surrounding the orifice, the gas and the plasma being in contact with the portion of the vacuum enclosure surrounding the orifice at least on the outside of the vacuum enclosure.

Membrane and frame assembly 155 may be manufactured by the following embodiment. Membrane 410 may be a deposited layer overlying a substrate. The substrate may be a semiconductor such as silicon. The substrate is removed from a window region 480 through a substantial portion of the substrate, or preferably through the entire substrate to form a frame 430 to support the membrane. The electron beam from the electron beam generator may be directed through the window region in the frame and at first surface 440 of the membrane. Membrane 410 may be fabricated by thin film deposition (for example, by low pressure chemical vapor deposition) of silicon nitride ($Si_xN_y$) overlaying a silicon (Si) substrate. Then, one or more small sections of the substrate (corresponding about to the desired size of the window region or slit through which the electron beam is transmitted) are removed by photolithography and chemical etching. The substrates are subsequently divided into individual sections, each including a Si frame with one or more $Si_xN_y$ window regions or slits, forming the membrane and frame assemblies.

In one embodiment, the second conductor may include the membrane if the membrane is formed from sufficiently conductive material. For example, the membrane may be made of graphite. If a conductive material is used to form the membrane, the conductive film may be optionally omitted. In this embodiment, the mounting of the membrane and frame assembly to the vacuum enclosure may include an insulating spacer if the frame is also formed of conducting material.

Figure 5:
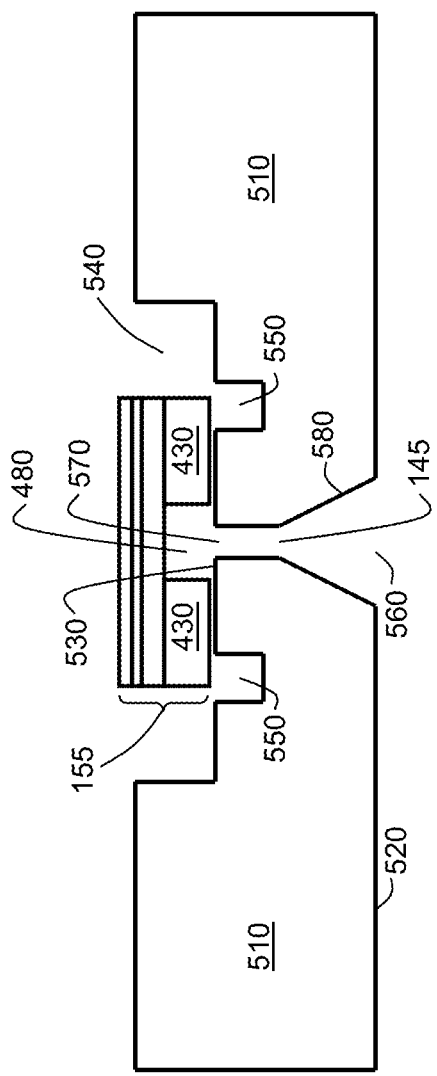
FIG. 5 is a simplified cross section view of a membrane and frame assembly attached to a portion of a vacuum enclosure, in accordance with one embodiment of the present invention.

FIG. 5 is a simplified cross section view of a membrane and frame assembly 155 attached to the portion of the vacuum enclosure 140a, in accordance with one embodiment of the present invention. The portion of the vacuum enclosure 140a may include a separate piece of the vacuum enclosure called a vacuum flange 510 (hereinafter alternatively referred to as flange) which attaches to the rest of the vacuum enclosure via vacuum seals and bolts. Alternatively the vacuum enclosure 140 may be formed from a single piece or a multitude of pieces (not shown).

Vacuum flange 510 may have a first surface 520 facing towards the inside of the vacuum enclosure and a second surface 530 facing towards the outside of the vacuum enclosure. Orifice 145 extends through the vacuum flange from the first surface to the second surface of the vacuum flange. The vacuum enclosure is adapted so as to couple frame 430 to the vacuum enclosure by a bond or clamp on the exterior of the vacuum enclosure and to position window region 480 in membrane and frame assembly 155 to match or line up with orifice 145 so as to enable the electron beam to pass through orifice 145, window region 480 and then strike the first surface of the membrane. Frame 430 may be bonded or clamped onto vacuum flange 510 having an opening 540 that matches or is somewhat larger than membrane and frame assembly 155 using, for example, ultra-high vacuum compatible glue or epoxy (not shown).

Optionally, special features may be defined onto the flange to facilitate the bonding process and ensure optimal vacuum compatibility. For example, the flange may include a glue groove 550 shaped as a "picture frame" around the periphery of the opening in the flange to aid bonding. Guiding channels for electronics wiring or pins may be included to facilitate the centering of the membrane and frame assembly onto the flange and to establish electrical contact with the conductive film on the membrane in order to measure and apply signals via the plasma probes; for example by using gold contact pins or spring leaves (not shown).

Furthermore, in one embodiment, the membrane flange is preferably designed in such a way as to minimize impact from the electron beam. Orifice 145 may include a first end 560 on the inside (side facing the electron beam generator) of the vacuum enclosure and a second end 570 on the side opposite the inside of the vacuum enclosure. First end 560 of orifice 145 may include a tapered opening 580 being wider than second end 570 of the orifice to minimize arcing and charging from the electron beam. In another embodiment, the portion of the vacuum enclosure surrounding the orifice may be adapted so as to minimize magnetic fields that may build up over time and cause problems with electron beam control. For example, the material for the portion of the vacuum enclosure 140a or vacuum flange 510 may be chosen from appropriate materials to minimize magnetic fields including SST 316.

Figure 6:
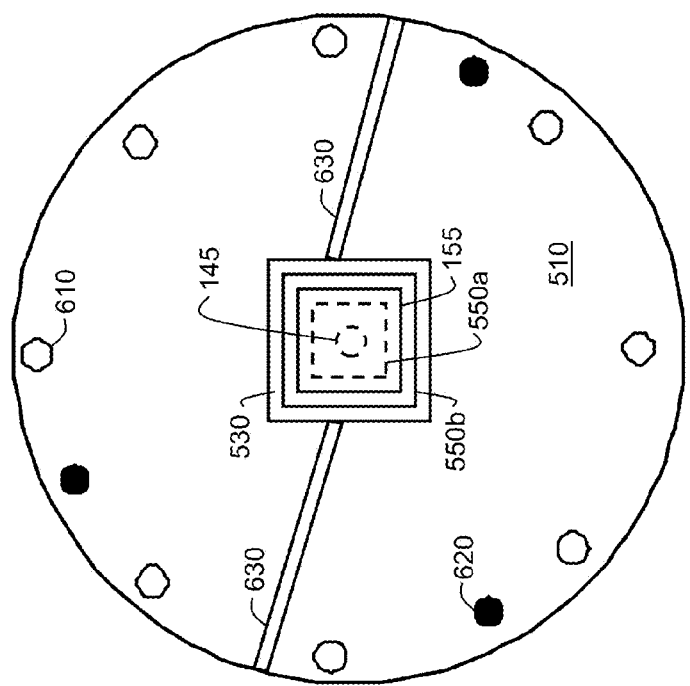
FIG. 6 is a simplified plane view of a membrane and frame assembly attached to a portion of a vacuum enclosure, in accordance with one embodiment of the present invention.

FIG. 6 is a simplified plane view of a membrane and frame assembly 155 attached to the portion of the vacuum enclosure 140a or 510, in accordance with one embodiment of the present invention. The embodiment shown in FIG. 6 corresponds to the embodiment shown in FIG. 5 except for the following new elements. Vacuum flange 510 may include one or more threaded bores 610 for a mechanical interface, one or more through-hole 620 for a faraday cup jig (not shown), and one or more guiding channel 630 for electronics wiring to facilitate establishing electrical contact with the conductive film on the membrane in order to measure and apply signals via the plasma probe. The glue groove is shown extending between an inner edge 550a just inside the perimeter of membrane and frame assembly 155, and an outer edge 550b of the glue groove extending just beyond the perimeter of membrane and frame assembly 155. The other elements in FIG. 6 have the same functions as those in FIG. 5 with the same reference numbers and will not be described in detail again.

Figure 7:
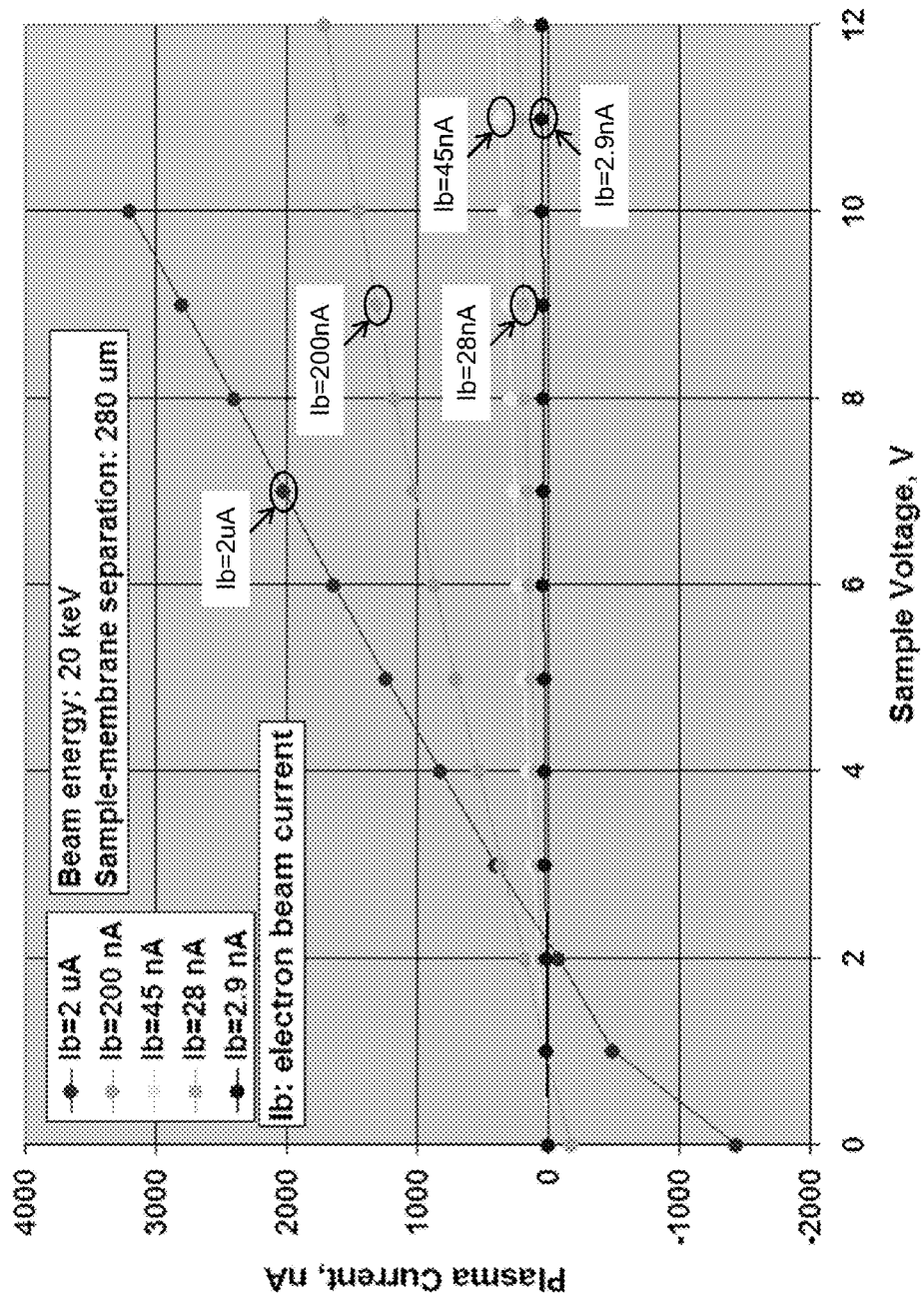
FIG. 7 shows exemplary characterization data for plasma current, electron beam current, and sample voltage associated with the non-mechanical contact signal measurement apparatus of FIGS. 1 and 2.

FIG. 7 shows exemplary characterization data for plasma current, electron beam current, and sample voltage associated with the non-mechanical contact signal measurement apparatus of FIGS. 1 and 2. FIG. 7 shows experimental verification results of the electron-beam induced plasma-probe when a structure under test held at atmospheric conditions is irradiated with an electron beam transmitted through a membrane that is semi-transparent to electrons and coated with a conductive film. In other words FIG. 7 shows the I-V characteristics of the plasma probes at different beam currents. A current flowing between the structure under test and the conductive film on the membrane may be measured when a voltage is applied to the structure under test. The current increases as a function of applied voltage, meaning that this current may be used to measure the voltage applied on the sample. However, when the structure under test is held in vacuum or when the electron beam is turned off so that no plasma forms, no current is measured in either case, which verifies that the measured current signals described earlier are related to the interaction between the electron beam and the atmosphere creating the plasma probe. This current signal may be amplified by increasing the electron beam current, Ib.

FIG. 8 shows exemplary characterization data for plasma beam spatial response associated with the non-mechanical contact signal measurement apparatus of FIGS. 1 and 2. In other words, FIG. 8 characterizes the lateral dimensions of the plasma and shows results of plasma diameter measurements. These tests were carried out by stepping the beam across a conductive-insulating interface on a structure under test and measuring the resulting plasma current. The plasma diameter measured using this approach was 130 um for an estimated working distance of at least 150 um. This is in the right order of magnitude for this working distance and would be sufficient resolution for measurements on most TV-type thin-film-transistor (TFT) displays. The plasma diameter may be reduced further by adjusting the plasma parameters such as, for instance, electron beam energy, gap distance, and the like.

Figure 9:
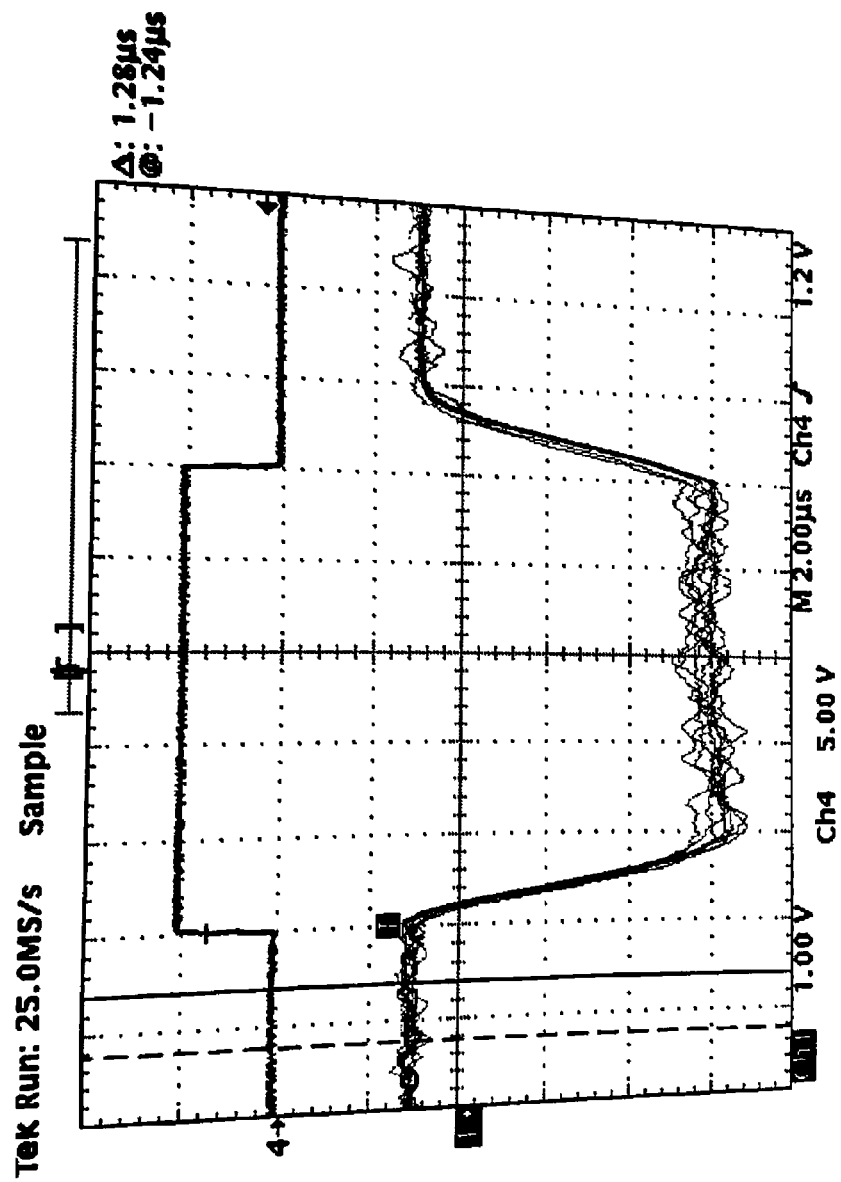
FIG. 9 shows exemplary characterization data for plasma beam temporal response associated with the non-mechanical contact signal measurement apparatus of FIGS. 1 and 2.

FIG. 9 shows exemplary characterization data for plasma beam temporal response associated with the non-mechanical contact signal measurement apparatus of FIGS. 1 and 2. The temporal behavior of the plasma probe was verified using an alternating voltage source, a current amplifier, and an oscilloscope. For a step function voltage applied to the structure under test displayed on the top waveform, the plasma probe signal rise time displayed on the bottom waveform is less than 2 μsec. Plasma modeling, as described above, shows that typical rise time is actually in the order of 100 nsec or less, so it is assumed that the bandwidth of circuit components other than the plasma were the limiting factor in this experiment.

Verification and testing applications of the e-beam induced plasma probe technology may include but are not limited to the following example structures. Electrical defects may be detected in LCD thin film transistor (TFT) arrays by measurement of voltages on pixel electrodes (LCD array tester). Electrical defects may be detected in organic light emitting diode (OLED) TFT arrays by direct measurement of current on pixel electrodes (OLED array tester). Opens and shorts may be detected in drive lines of LCD and OLED display TFT arrays (open/short tester). LCD and OLED display TFT arrays may be verified after deposition-repair. Similar applications as mentioned above for use in PCB and semiconductor device fabrication may be provided. Solar panel voltage or current measurement may be provided.

Figure 10:
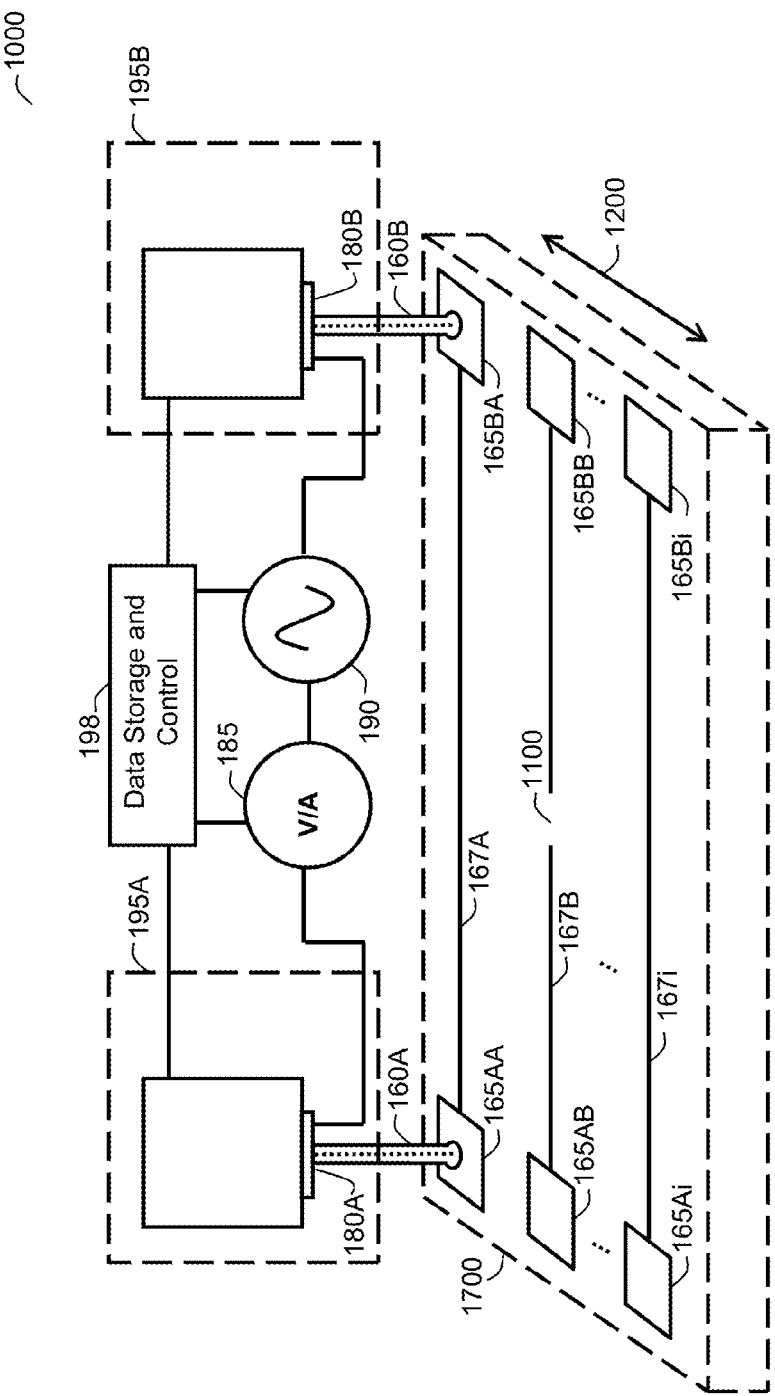
FIG. 10 is a schematic and perspective view of a dual probe non-mechanical contact signal measurement apparatus, in accordance with a one embodiment of the present invention.

A multitude of plasma probes may be directed at different locations on the structure under test at the same time. FIG. 10 is a schematic and perspective view of a dual-probe non-mechanical contact signal measurement apparatus 1000, in accordance with one embodiment of the present invention. Dual-probe non-mechanical contact signal measurement apparatus 1000 includes a first inspection head 195A, which generates a first plasma probe 160A, and a second inspection head 195B, which generates a second plasma probe 160B. First and second plasma probes 160A and 160B are directed at a pair of first conductor regions 165AA and 165BA, respectively, which are spaced apart on a structure under test 1700. The pair of first conductor regions 165AA and 165BA are coupled to opposite ends of line 167A, which is one example of a simple circuit on the structure under test. For example, line 167A may be a data line, a gate line, or a common line on a TFT array under test. Signal source 190 is coupled to electrical measurement device 185 through a series connected loop via a second conductor 180B on second inspection head 195B, second plasma probe 160B, first conductor region 165BA, line 167A, first conductor region 165AA, first plasma probe 160A, and a second conductor 180A on first inspection head 195A. The electrical measurement device responds to the signal source with a first electrical signature since line 167A is continuous.

For example, line 167A may be one of a multitude of i lines 167A through 167i, which are arranged in an array on a TFT display. Each line may have its own respective pair of first conductor regions located at opposite ends of each line. The inspection heads 195A and 195B may be adapted to move the first and second plasma probes 160A and 160B in the direction perpendicular to the length dimension of the lines as indicated by directional arrow 1200. The movement of the plasma probes may be accomplished by mechanically moving the inspection heads, electronically scanning the e-beams that generate the first and second plasma probes using the deflection optics, or by a combination of mechanical movement and electronic scanning. In this example, line 167B includes an open defect 1100. When the first and second inspection heads direct the first and second plasma probes to the pair of first conductor regions 165AB and 165BB, which are coupled to opposite ends of line 167B, the series connected loop is broken via open defect 1100 on line 167B. Then, the electrical measurement device responds to the signal source with a second electrical signature that detects the open defect. In this example, an alternating current, high frequency signal in the Mhz range may be advantageous to overcome variations in plasma resistance that may otherwise mask the open defect's electrical test signature if a direct current signal were to be used instead.

Multiple plasma probes may inject and/or measure different signals onto the structure under test for functional testing of complex circuitry.

In one embodiment, multiple plasma probes may inject and/or measure different signals onto the structure under test for functional testing of complex circuitry without the damage associated with mechanical probing. For example, multiple plasma probes used in a Kelvin test arrangement may more accurately sense conductivity changes in the circuits under test.

Many different system architectures may be envisioned. In one embodiment, non-mechanical contact signal measurement apparatus systems based on electron beam plasma probes may incorporate one or more inspection heads depending on throughput requirements. In another embodiment, the non-mechanical contact signal measurement apparatus may be adapted so as to mechanically move the electron beam in relation to a position of the structure under test. In another embodiment, the plasma beam may be moved by electronically scanning the plasma beam in relation to a position of the structure under test. In another embodiment, the plasma beam may be moved by a combination of electronic scanning and mechanical movement. Alternatively, in another embodiment, the structure under test may move in relation to the plasma beam. In another embodiment, the system may be equipped with a mechanism to rotate the structure under test so that inspection along the main axes of the structure under test is achieved.

FIG. 11A is a block diagram top view of a non-mechanical contact signal measurement system 2000 with multiple, movable inspection heads, in accordance with one embodiment of the present invention. The structures under test in this example may again be TFT display TV panels or plates. Non-mechanical contact signal measurement system 2000 includes base 175, which may be large enough to simultaneously test a multitude of TFT displays 1701 through 1704 via a multitude of respective inspection heads 1951 through 1954. In this example, four TFT displays and four inspection heads are shown. However, in another embodiment, multiple inspection heads may be used to test a single TFT display, or one inspection head may be used to test multiple TFT displays.

Inspection heads 1951 through 1954 are mechanically attached to a gantry 2100 so that each of the inspection heads may mechanically move independently in the Y direction as shown. The X and Y directions shown are in the plane parallel to the surface of the TFT displays. At least one probe bar 2200 may be used to apply a multitude of electrical signals and power to the TFT displays via mechanical probing techniques. Each of the inspection heads may also electronically scan their respective plasma probes in the X direction. The electronically scanned plasma probes may be implemented using at least one long and narrow membrane slit and at least one electron beam which is deflected along the long side of the slit by the at least one deflection optic. The combination of electronically scanning the plasma probe in the X direction while simultaneously mechanically moving the inspection heads in the Y direction covers a portion of an inspection slice area 2400 on each TFT display and may advantageously reduce test time as explained in more detail below. In one embodiment, the inspection heads may include more than one plasma probe to be able to test a greater portion of the inspection slice area 2400 or even the entire area. The width of the inspection slice area 2400 in the X direction may be determined by the product of the number of beams per inspection head and the distance scanned by each beam. Gantry 2100 may mechanically move the inspection heads in the X direction after testing of inspection slice area 2400 is completed in order to test the next slice area, or for example, to unload the TFT display.

In an alternative embodiment, the gantry 2100 may instead be positioned with its long dimension in the X direction so as to mechanically move in the Y direction all the inspection heads attached thereto, while the plasma probe is electronically scanned in the X direction and the inspection heads mechanically step in the X direction after testing an inspection slice is completed.

FIG. 11B is a magnified inset showing details of plasma probe movement in the apparatus of FIG. 11A, in accordance with one embodiment of the present invention. FIG. 11A shows how the combination of electronically scanning the plasma probe in the X direction while simultaneously mechanically moving the inspection heads in the Y direction causes the plasma probe to move in a first diagonal scan 2500 from a first probe location 2510 to a second probe location 2520. The mechanical motion of the inspection head and the simultaneous electronic scanning of the plasma probe may be adapted so as to cause the plasma probe to traverse the height of a single pixel row Ph on the TFT display coincident with the electronic scanning of the beam in the X direction along a length Ps along the row of TFT pixels. For example, length Ps corresponds to the distance scanned by each beam in the X direction described above. The movement of the inspection head may be continuous in the Y direction because the probe may reset very quickly from second probe location 2520 at the end of first diagonal scan 2500 on a first row of TFT pixels to a third probe location 2610 at the start of second diagonal scan 2600 on a second row of TFT pixels located above the first row of TFT pixels in the Y direction. Thus, faster test coverage of inspection slice area 2400 is achieved than possible with only mechanical movement of the plasma probe across the TFT display surface.

In one embodiment, in addition to a full-scale electrical tester for OLEDs, as well as LCDs, the non-mechanical contact signal measurement apparatus using an electron beam-induced plasma probe may perform on-demand electrical review in combination with other primary inspection technologies, such as Automatic Optical Inspection (AOI) or electro-optical testing using Orbotech's ArrayChecker™ systems. Defects in circuit 167 (shown above in FIG. 1) on structure under test 170 are first monitored using the primary inspection technology without the use of the plasma probe. If a defect is detected by the primary inspection technology, its characteristic, such as location or type, may be registered in a control unit within data storage and control block 198. If a defect is detected, the non-mechanical contact signal measurement apparatus using the plasma probe may then take a multitude of data values with electrical measurement device 185 to better characterize the defect in more detail. The defect may, for example, be a pixel(s) in a defective area of the display. The more detailed characterization data associated with the defect may be used to determine the origin of the defect and provide information for repair of the defect, without further damaging the display as would happen with mechanical probing. The multitude of data values from electrical measurement device 185 may be stored in a data storage unit within data storage and control block 198. Operation of the data storage unit, electrical measurement device 185, and signal source 190 is coordinated and controlled by a control unit within data storage and control block 198 using test routines stored in the data storage unit.

For example, upon detection of a defective pixel in an LCD panel by the ArrayChecker™ system, the transfer characteristics of the TFT in the pixel in question may be verified by placing the electron beam-induced plasma probe on at least one of the pixel electrodes, setting the data voltage Vds to its nominal value (about 5-10 V), sweeping the gate voltage Vg and measuring the resulting Ids current. Alternatively, Ids versus Vds can be measured for fixed values of Vg. In OLED pixels, which usually have two or more transistors, more complex measurements can be performed involving multiple drive signals varying as a function of time. Note that these measurements may require some external signals to be driven to the panel under test using conventional mechanical probing in regions designed to accept mechanical probes, while at least one plasma probe is used to measure or inject signals on the structure under test using non-mechanical probing in areas where mechanical probing would likely further damage the display. Since the mechanically probed driving signals are the same as those used for full panel testing using systems such as the ArrayChecker™, the "on-demand electrical review" capability of the plasma probe adds less complexity in terms of additional system functionality required when incorporated in the ArrayChecker™ system rather than an AOI system, which does not already have the mechanical probing capability.

An alternative embodiment of the detailed electrical measurement capability using the plasma probe described above may be a stand-alone electrical characterization system. Using such a system, the performance of TFTs in the active areas of LCD or OLED displays can be sampled in a non-destructive fashion without necessary prior knowledge of defect locations. The non-mechanical contact signal measurement apparatus using the plasma probe may take a multitude of data values with electrical measurement device 185 to characterize the circuit on the structure under test in detail. The multitude of data values from electrical measurement device 185 may be stored in a data storage unit within data storage and control block 198. Operation of the data storage unit, electrical measurement device 185, and signal source 190 is coordinated and controlled by a control unit within data storage and control block 198 using test routines stored in the data storage unit. This capability allows the monitoring of device performance and uniformity, which may help identify process issues, especially during the ramp-up phase of the production of new TFT panel designs.

In one embodiment, the control unit may coordinate setting a first electrical characteristic of a first signal line on the structure under test to a first condition. For example, the voltage on a gate line on a TFT array under test may be set to a first voltage via conventional mechanical probing. Then the controller may store a first one of the multitude of data values associated with a second electrical characteristic of a second signal line on the structure under test, the first data value being associated with the first condition. The second signal line may be probed by the e-beam induced plasma and the data value associated with that second signal line may be measured by the electrical measurement device. For example, the e-beam induced plasma may be used to probe the voltage on a pixel electrode, which may be coupled to the drain of a TFT located in an array under test. The value of the voltage measured by the plasma probe via the electrical measurement device, may be stored in the data storage unit. Then the controller may set the first electrical characteristic to a second condition, i.e. the voltage on the gate line is changed to a second voltage. Then the controller may store a second one of the multitude of data values associated with the second electrical characteristic, the second data value being associated with the second condition. For example, the voltage on the pixel electrode coupled to the drain of the same TFT, is measured again by the plasma probe via the electrical measurement device, and stored in the data storage unit. Thus, the first drain voltage data is associated with the first gate voltage and the second drain voltage data is associated with the second gate voltage. The second electrical characteristic is responsive to the first electrical characteristic through the circuit. For example, the drain line may respond to the gate line through a mutually connected transistor, i.e. the circuit. The controller may repeat the above sequence until the desired amount of data is acquired in the data storage unit and the characteristics may then be output for review via a graphical user interface or hard copy generated by conventional techniques.

The plasma probe technology has advantages over existing solutions, such as the IV-probe currently used in Array-Checker™ systems for "on-demand" electrical review. These existing solutions rely on physical contact (using e.g. a sharp needle) to the pixels under test. This approach invariably results in damage to the mechanically contacted pixels and is therefore in general not used on the active area of LCD or OLED panels, but rather on test areas adjacent to the panels. Therefore the existing technology does not readily allow the electrical review of defects detected by other primary inspection technology means. In addition, unlike plasma probing technology, mechanical contact probing is rather slow since the needle must be raised and lowered in between each inspected pixel, and provides poorer spatial selectivity, especially on panels with small features (e.g. OLED displays).

In one embodiment, electrical inspection systems incorporating the "on-demand electrical review" capability may be configured for high throughput by mounting the electron beam-induced plasma probe inspection heads on a stage allowing independent, interference-free motion of these heads, so that the primary inspection without plasma probe and the electrical review using plasma probe can be performed in parallel. This can, for example, be achieved by installing the electron beam-induced plasma probe inspection heads on a separate gantry, or on the back of the gantry on which the inspection heads used for the primary inspection are mounted. Alternatively, the plasma probe electrical review station can be installed on the same physical mount as the inspection head used for the primary inspection, as is the case for the current IV-probe. In this case, parallel inspection and on-demand electrical review is not possible, but this may be acceptable in many situations, especially during process development.

For more accurate defect review results and preferably for electrical characterization, electrical testing using the plasma probe may be performed in the dark to prevent the creation of photo-induced carriers. Such carriers may mask defects, such as channel defects, that lead to high TFT OFF currents. In one embodiment the non-mechanical contact signal measurement apparatus is enclosed or adapted so as to reduce light incident on structure under test 170 so that reducing the light improves the accuracy of a data value from electrical measurement device 185.

The above embodiments of the present invention are illustrative and not limiting. Various alternatives and equivalents are possible. Although, the invention has been described with reference to a single plasma probe by way of an example, it is understood that the invention is not limited by the number of plasma probes. Although, the invention has been described with reference to a plasma with circular shape by way of an example, it is understood that the invention is not limited by the shape of the plasma. The embodiments of the present invention are not limited by the type of substrate material used to form the frame supporting the membrane. The embodiments of the present invention are not limited by the shape of the membrane, frame, or vacuum enclosure. The embodiments of the present invention are not limited by the method of attachment of the membrane or frame to the vacuum enclosure. The embodiments of the present invention are not limited by the type of electrical measuring devices or signal sources coupled to the plasma or their number. The embodiments of the present invention are not limited by the way the plasma probe is moved in relation to the structure under test. Further, the invention may be used in testing applications requiring non-physical contact or contact-less probing not limited to the testing of thin-film-transistor arrays, such as other circuits on flat panels, microelectronic circuits, circuit boards, solar panels, semiconductor circuits, and so on. Other additions, subtractions, or modifications are obvious in view of the present disclosure and are intended to fall within the scope of the appended claims.

What is claimed is:

1. A non-mechanical contact signal measurement apparatus for testing a device having a conducting circuit, comprising:
   a vacuum chamber;
   an electron beam generator generating an electron beam inside the vacuum chamber;
   a membrane having a first surface facing towards the inside of the vacuum chamber and a second surface facing outside the vacuum chamber, the membrane configured to preserve vacuum inside the vacuum chamber and to transmit the electron beam out of the vacuum chamber so as to induce a plasma in gas where the electron beam passes through the gas outside the vacuum chamber;
   a conductive film overlaying the second surface of the membrane;
   an electrical measurement device electrically connected to the conductive film; and
   wherein an electrical signal is detected from the device through the conducting circuit, the plasma, and the conductive film when the plasma is directed on the conducting circuit, the electrical measurement device being responsive to the electrical signal.

2. The non-mechanical contact signal measurement apparatus of claim 1, further comprising:
   a frame supporting the membrane, the frame having an orifice extending therethrough.

3. The non-mechanical contact signal measurement apparatus of claim 1, further comprising an adhesion layer provided between the membrane and the conductive film.

4. The non-mechanical contact signal measurement apparatus of claim 3, wherein the adhesion layer comprises one of Ti or TiW.

5. The non-mechanical contact signal measurement apparatus of claim 4, wherein the conductive film comprises one of: Au, Ti, Be, Sc, V or Cr.

6. The non-mechanical contact signal measurement apparatus of claim 1 further comprising:
   a plurality of electron beams directed into the gas so as to induce a plurality of plasmas in the gas where the electron beams pass through the gas.

7. The non-mechanical contact signal measurement apparatus of claim 1 wherein the device under test is a thin film transistor array.

8. The non-mechanical contact signal measurement apparatus of claim 1 wherein the electron beam generator comprises: an electron source, an electron lens and deflection optics.

9. The non-mechanical contact signal measurement apparatus of claim 1 further comprising:
   a data storage unit coupled to the measurement device and adapted to store a plurality of data values from the measurement device; and
   a control unit coupled to the data storage unit, measurement device, and signal source wherein the data storage unit, measurement device, and signal source are responsive to the control unit.

10. The non-mechanical contact signal measurement apparatus of claim 1 further comprising:
    an enclosure adapted to reduce a light incident on the device under test wherein reducing the light improves the accuracy of a data value from the electrical measurement device.

11. The non-mechanical contact signal measurement apparatus of claim 1 further comprising:
    a signal source providing test signals to the device.

12. The non-mechanical contact signal measurement apparatus of claim 1, wherein the membrane comprises silicon nitride overlaying a silicon substrate.

13. The non-mechanical contact signal measurement apparatus of claim 2 wherein the vacuum enclosure includes a vacuum flange, the orifice extending through the vacuum flange.

14. The non-mechanical contact signal measurement apparatus of claim 2 wherein the orifice has a tapered opening.

15. The non-mechanical contact signal measurement apparatus of claim 1 wherein the electron beam generator comprises:
    at least one electron source; and
    at least one electron lens adapted to focus the beam to a spot size.

16. The non-mechanical contact signal measurement apparatus of claim 1, further comprising a gap control mechanism configured to maintain a gap from the device to the conductive film on the membrane to from 30 to 500 µm.

17. The non-mechanical contact signal measurement apparatus of claim 1 wherein the membrane includes a material chosen from the group consisting of silicon nitride, silicon carbide, alumina, diamond-like carbon, graphite, silicon dioxide, ultrathin carbon, beryllium, beryllium nitride and polyimide.

18. The non-mechanical contact signal measurement apparatus of claim 1 wherein the membrane includes a deposited layer overlying a substrate, a window region is formed through a portion of the substrate, the substrate is adapted to form a frame supporting the membrane, and the electron beam is directed through the window region in the frame.

19. The non-mechanical contact signal measurement apparatus of claim 1 wherein the conductive film is deposited over the membrane to a thickness of from 10 nm to 50 nm.

20. The non-mechanical contact signal measurement apparatus of claim 15 further comprising:
    a plurality of electron sources.

21. The non-mechanical contact signal measurement apparatus of claim 18 wherein the frame is coupled to the vacuum enclosure by a bond or clamp so as to position the window region to match with the orifice enabling the at least one electron beam to strike the membrane through the window region in the frame.

22. The non-mechanical contact signal measurement apparatus of claim 18 wherein the window region is shaped as a slit and the electron beam generator includes:
    at least one electron source;
    at least one electron lens to focus the beam to a spot size; and
    at least one deflection optic adapted so as to scan the electron beam through the slit.

23. The non-mechanical contact signal measurement apparatus of claim 19 wherein the conductive film includes an adhesion layer overlaying the membrane and a conductive layer overlaying the adhesion layer, the gas and plasma being coupled to the conductive layer.

24. A method for signal measuring from a structure under test having a conducting circuit by non-mechanical contact, the method comprising:
    providing an electron beam generator generating an electron beam inside a vacuum chamber;
    providing a membrane configured to preserve vacuum inside the vacuum chamber and to transmit the electron beam out of the vacuum chamber, and a conductor overlaying exit surface of the membrane;
    directing at least one electron beam through the membrane and the conductor so as to exit the vacuum chamber and focus on the conductive circuit, whereby the electron beam induces a plasma in gas existing between the conductor and the structure under test, where the electron beam passes through the gas, such that the plasma electrically contacts the conducting circuit of the structure under test and the conductor overlying the membrane;
    coupling a measurement device to the conductor to thereby electrically contact the plasma; and
    coupling a signal source to the conducting circuit of the device so as to form a conductive loop with the electrical measurement device, the conductor, the conducting circuit, and the plasma when the plasma is directed on the conducting circuit, so as to cause the electrical measurement device to respond to the signal source.

25. The method of claim 24
    wherein directing the electron beam to focus on the conductive circuit comprises wherein directing the electron beam to contact a conductive region of the conductive circuit.

26. The method of claim 24 wherein causing the electrical measurement device to respond to the signal source comprises causing the electrical measurement device to measure voltages or current on pixel electrodes.

27. The method of claim 24 wherein the gas is air, molecular nitrogen, or an inert gas.

28. The method of claim 24 further comprising:
    directing a plurality of electron beams into the gas so as to induce a plurality of plasmas in the gas where the electron beams pass through the gas.

29. The method of claim 24 further comprising:
    testing a thin film transistor array.

30. The method of claim 24 further comprising:
    moving the at least one electron beam in relation to a position of the structure under test.

31. The method of claim 25 further comprising:
storing a plurality of data values from the electrical measurement device in a data storage unit, the plurality of data values being associated with the circuit on the structure under test; and
controlling the data storage unit, electrical measurement device, and signal source by a control unit.

32. The method of claim 24 further comprising:
monitoring for a defect in the circuit on the structure under test;
registering in a control unit if the defect is detected;
storing a plurality of data values from the electrical measurement device in a data storage unit if the defect was detected, the plurality of data values being associated with the defect in the circuit on the structure under test; and
controlling the data storage unit, electrical measurement device, and signal source by the control unit.

33. The method of claim 24 wherein the controlling step includes:
setting a first electrical characteristic of a first signal line on the structure under test to a first condition;
storing a first one of the plurality of data values associated with a second electrical characteristic of a second signal line on the structure under test, the first data value being associated with the first condition;
setting the first electrical characteristic to a second condition; and
storing a second one of the plurality of data values associated with the second electrical characteristic, the second data value being associated with the second condition, wherein the second electrical characteristic is responsive to the first electrical characteristic through the circuit.

34. The method of claim 24 further comprising:
focusing the electron beam to a spot size; and
scanning the electron beam.

35. A method of fabricating a plasma probe for electrical measurement of a device under test, comprising:
providing a vacuum enclosure having an orifice;
affixing an electron source and electron lens inside the vacuum enclosure, the electron lens generating an electron beam and directing the electron beam through the orifice;
affixing a membrane to the vacuum enclosure at the orifice, the membrane having a first surface facing interior of the vacuum enclosure and a second surface facing outside the vacuum enclosure;
affixing a conductive film to overlay the second surface of the membrane;
affixing a conducting contact to the conductive film; wherein,
when the electron beam exits the orifice it generates plasma so that an electrical measurement device connected to the conducting contact detects an electrical signal through the plasma and the conductive film when the plasma is directed on a conducting circuit of the device under test.

36. The method of claim 35 further comprising:
transmitting a first portion of the one electron beam through the membrane.

37. The method of claim 35 further comprising:
providing a vacuum flange; and
extending the orifice through the vacuum flange.

38. The method of claim 35 further comprising:
coupling a portion of the vacuum enclosure surrounding the orifice to the gas and the plasma, the portion of the vacuum enclosure surrounding the orifice being the second conductor.

39. The method of claim 35 further comprising:
focusing the electron beam to a spot size.

40. The method of claim 36 wherein the membrane includes a material chosen from the group consisting of silicon nitride, silicon carbide, alumina, diamond-like carbon, graphite, silicon dioxide, ultrathin carbon, beryllium, beryllium nitride and polyimide.

41. The method of claim 36 further comprising:
depositing the membrane as a layer overlying a substrate;
forming a frame to support the membrane by removing etching a window region through a portion of the substrate.

42. The method of claim 36 further comprising:
transmitting a second portion of the at least one electron beam through a conductive film overlaying the membrane.

43. The method of claim 41 further comprising:
coupling the frame to the vacuum enclosure by a bond or clamp; and
positioning the window region to match with the orifice.

44. The method of claim 41 further comprising:
overlaying the membrane by an adhesion; and
overlaying the adhesion layer by a conductive layer.

45. A method for signal measuring from a device having a conducting circuit by non-mechanical contact, the method comprising:
providing an electron beam generator generating an electron beam inside a vacuum chamber;
providing a membrane configured to preserve vacuum inside the vacuum chamber and to transmit the electron beam out of the vacuum chamber, and a conductor overlaying exit surface of the membrane;
directing at least one electron beam through the membrane and the conductor so as to exit the vacuum chamber and focus on the conductive circuit, whereby the electron beam induces a plasma in gas existing between the conductor and the device, where the electron beam passes through the gas, such that the plasma electrically contacts the conducting circuit of the device and the conductor overlaying the membrane;
coupling a signal source to the conductor to thereby electrically contact the plasma; and
coupling a measurement device to the conducting circuit of the device so as to form a conductive loop with the signal source, the conductor, the conducting circuit, and the plasma when the plasma is directed on the conducting circuit, so as to cause the electrical measurement device to respond to the signal source.

* * * * *